(12) United States Patent
Zhang et al.

(10) Patent No.: US 6,747,516 B2
(45) Date of Patent: Jun. 8, 2004

(54) POWER CONTROLLER CIRCUIT FOR A POWER AMPLIFIER STAGE

(75) Inventors: Shuyun Zhang, Brookline, MA (US); Robert Jeffery McMorrow, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/283,793

(22) Filed: Oct. 30, 2002

(65) Prior Publication Data

US 2004/0085129 A1 May 6, 2004

(51) Int. Cl.[7] ............................................... H03G 3/10
(52) U.S. Cl. ....................................... 330/285; 330/288
(58) Field of Search ................................. 330/285, 296, 330/288; 323/315, 316

(56) References Cited

U.S. PATENT DOCUMENTS

| | | | | |
|---|---|---|---|---|
| 4,816,772 A | * | 3/1989 | Klotz ........................... | 330/254 |
| 6,369,657 B2 | * | 4/2002 | Dening et al. ............... | 330/296 |
| 6,404,287 B2 | * | 6/2002 | Dening et al. ............... | 330/296 |
| 6,489,812 B1 | * | 12/2002 | Savard et al. .................. | 327/59 |

* cited by examiner

*Primary Examiner*—Henry Choe
(74) *Attorney, Agent, or Firm*—Iandiorio & Teska

(57) ABSTRACT

A power controller circuit for a power amplifier stage includes an exponential power control circuit responsive to a power control signal for providing an exponential control current to control power amplifier stage and linear power control circuit responsive to the power control signal for supplementing the exponential control current to the power amplifier stage with a linear control current to produce a composite control current with a reduced and extended slope.

22 Claims, 9 Drawing Sheets

POWER CONTROLLER CIRCUIT FOR A POWER AMPLIFIER STAGE

FIELD OF THE INVENTION

This invention relates to a power controller circuit for a power amplifier stage, and more particularly to such a circuit which employs a linear power control circuit to supplement an exponential power control circuit.

BACKGROUND OF THE INVENTION

Most applications for a power amplifier (PA) require a method for controlling the output power level. This is particularly true for any type of transmission system for wireless communications. Controlling the output power level for a power amplifier can be an especially difficult task. The accuracy of these systems is so important that they may incorporate feedback systems with additional circuitry to detect the amount of power that is actually transmitted. However, such feedback systems typically do not eliminate the need to control the output power within the PA chip, module or system block.

PA power control is usually accomplished in one of two ways: varying the input drive level or varying the gain of the PA itself. For the former, a variable gain amplifier (VGA) or voltage variable attenuator (VVA) may be added to the input of the PA to vary the input drive level. The PA then acts as a fixed gain block with its output power being roughly proportional to the input drive level. This is a technique commonly used in systems requiring linear power amplifiers, such as IS-95 (CDMA), WCDMA, CDMA2000, and IS-136 (TDMA). The VGA or VVA can be made to amplify or attenuate the signal with low distortion, and the PA can be designed to operate in the linear region since the power control does not require a change in its bias condition and mode of operation. However, a PA system that varies the input drive level can require excessive circuitry due to the use of a VGA or VVA circuit.

Alternatively and preferably, the gain of the power amplifier can be varied by changing the bias level to the power amplifier. This is a more suitable approach for systems that use saturated PAs such as GSM, or AMPS. The PA in this case receives a fixed input drive level and the transmitted output power changes proportional to the gain. The gain of the PA can be changed by adjusting the bias level of the transistors in the signal chain. This approach requires less circuitry than varying the input drive level since there is no need for a VGA or VVA, and some of the same bias control circuitry can be used, with modifications, to control the gain. It is also slightly more efficient in DC power consumption due to a change in operating class with power.

Techniques are known in the art for controlling the linear, or small signal, gain of an amplifier by varying the bias. Over the years circuits have been developed that correct for device irregularities and provide stable bias control for supply voltage and temperature variations. However, the dynamic nature of the bias for a power amplifier can eliminate the usefulness of most of these techniques.

Most PA systems are operated in a manner in which large signal behavior undesirably affects the gain-bias relationship. For example, dynamic behavior can cause DC current consumption to be higher than it would be if no signal were being amplified. Dynamic behavior also leads to a condition known as self-biasing in which the interaction between the input signal of the device and the bias controller circuitry work to raise or lower the bias point. Signal biasing occurs when the signal energy at the device base or gate creates DC current flow as the device is pushed into forward saturation or reverse breakdown, which raises or lowers the bias point of the device and changes the resulting gain. There are other phenomena such as RF leakage into the bias controller, the relationship between the bias and gain of each stage of a multi-stage amplifier, and the change in power density versus class of operation that also undesirably affect the gain-bias relationship.

The result of these undesirable effects on the gain-bias relationship is that these bias control systems are typically characterized by extremely steep and poorly defined to control curves. A typical control curve for a three stage GSM power amplifier may have a slope that is as steep as 300–500 dBV. Both the steepness of the control slope and the fact that the control slope can drop to zero as the amplifier saturates is disadvantageous for systems employing closed loop power control.

BRIEF SUMMARY OF THE INVENTION

It is therefore an object of this invention to provide an improved power controller circuit for a power amplifier stage.

It is a further object of this invention to provide such an improved power controller system including a power controller circuit for one or more stages of a multistage power amplifier.

It is a further object of this invention to provide such an improved power controller circuit with reduced and extended slope of the control signal over the control range.

It is a further object of this invention to provide such an improved power controller circuit which is less complex and costly.

It is a further object of this invention to provide such an improved power controller circuit which has a marked improvement in average and peak slope of the control range.

It is a further object of this invention to provide such an improved power controller circuit which can be combined in a multistage peak amplifier to obtain an overall smoother response.

It is a further object of this invention to provide such an improved power controller circuit which can be easily implemented in a monolithic integrated circuit.

It is a further object of this invention to provide such an improved power controller which can be easily implemented using gallium arsenide HBT technology.

The invention results from the realization that an improved, less complex, and less costly power controller circuit for one or more power amplifier stages can be achieved by supplementing an exponential power control circuit with a linear power control circuit to produce a composite control current with a reduced and extended slope.

This invention features a power controller circuit for a power amplifier stage including an exponential power control circuit responsive to a power control signal for providing an exponential control current to control the power amplifier stage. A linear power control circuit responsive to the power control signal supplements the exponential control current to the power amplifier stage with a linear control current to produce a composite control current with a reduced and extended slope.

In a preferred embodiment the exponential power control circuit may include a current mirror and may include an emitter follower. The linear power control circuit may include a resistance connected to the power stage in parallel with the exponential power control circuit. The linear power control circuit may include a voltage divider circuit connected to the power stage in parallel with the exponential power control circuit. There may be a load circuit for drawing current from the power stage to reduce the slope of the composite control current at the upper end of the power control signal range. The exponential power control circuit may include a follower circuit and it may further include a second degenerative emitter follower circuit for reducing the slope of the composite control circuit at the upper end of the power control signal range.

This invention also features a power controller system for a multistage power amplifier including a power controller circuit associated with at least one of the stages and including an exponential power control circuit responsive to a power control signal for providing an exponential control current to control the power amplifier stage, and a linear power control circuit responsive to the power control signal for supplementing the exponential control current to the power amplifier stage with a linear control current to produce a composite control current with a reduced and extended slope.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
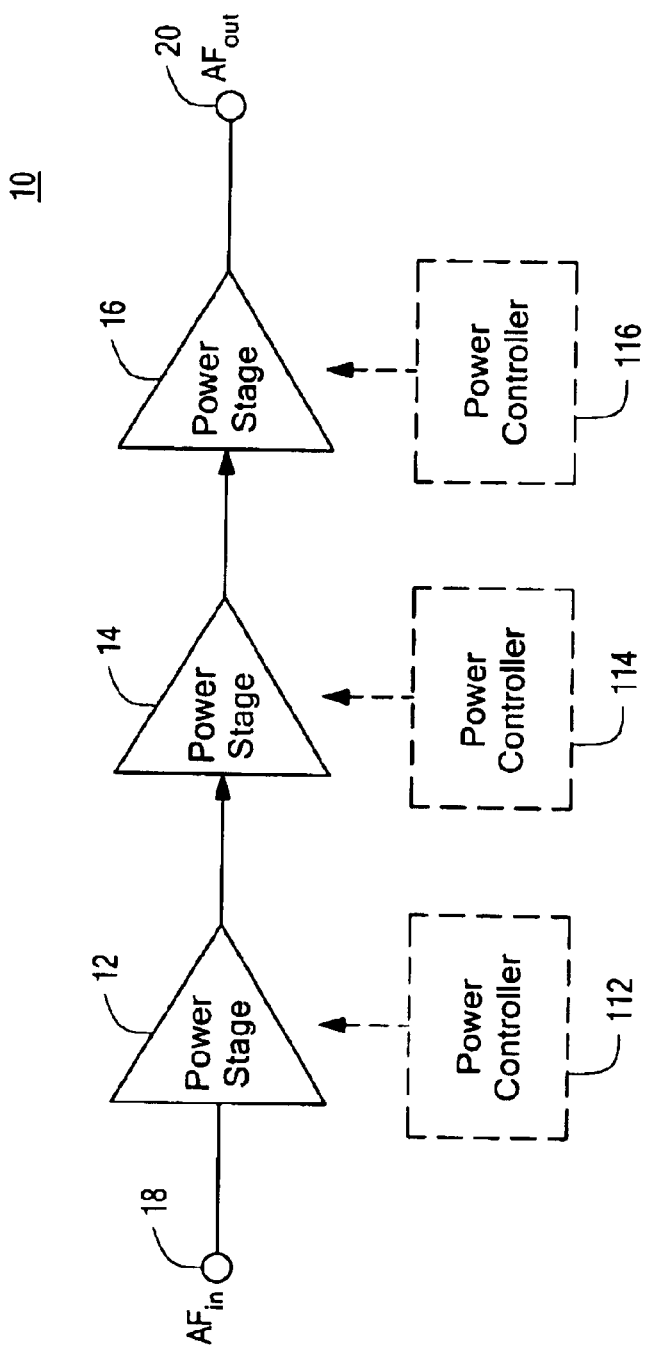
FIG. 1 is a schematic block diagram of a multistage power amplifier.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1 a multistage power amplifier 10 including three power stages 12, 14 and 16 which typically receive a radio frequency (RF) input at input terminal 18 and provide and RF output at terminal 20.

Figure 2:
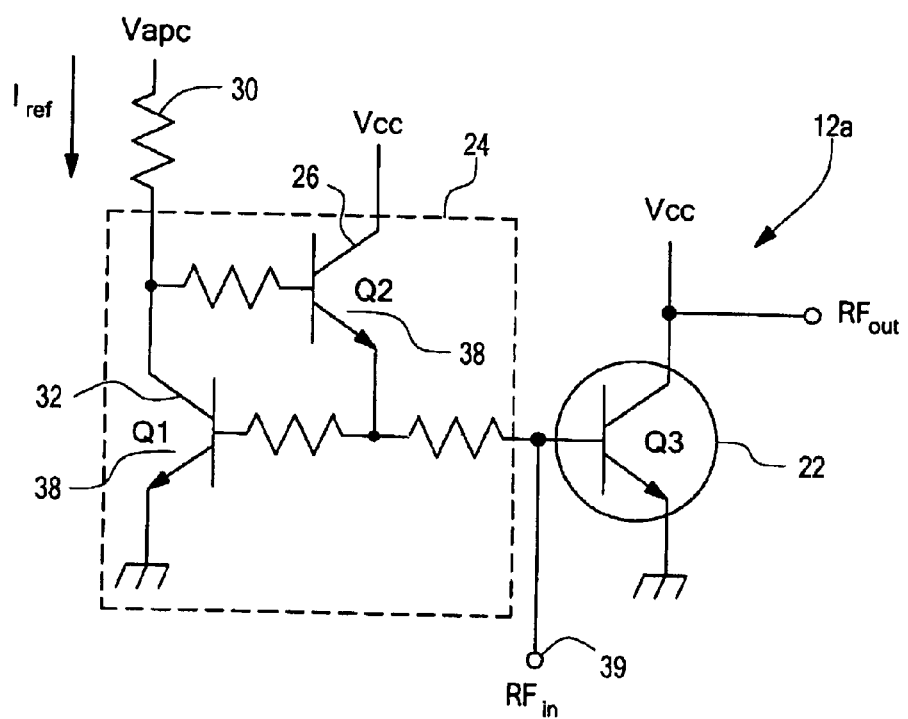
FIG. 2 is a schematic diagram of one stage of a prior art power amplifier.

The typical prior art power amplifier stage 12a, FIG. 2 includes a power amplifier transistor 22 and a power controller circuit 24. Power controller circuit 24 includes an exponential power control circuit, emitter follower circuit 26, and current mirror 28. The use of current mirror 28 allows a small control current to control the gain of output stage 12a. Power control signal, or control voltage, $V_{apc}$ (automatic power control) is applied through resistance 30 to current mirror 28 including transistor 32. Transistor 22 will mirror the current flowing through transistor 32 multiplied by the ratio of the area of the larger transistor 22 to the smaller transistor 32. At low levels, the control signal $V_{apc}$ does not turn on transistor 32 and transistor 22. When $V_{apc}$ is low, the RF signal at terminal 34, causes transistor 22 to conduct at a low level. When $V_{apc}$ rises and causes transistor 32 to turn on, transistor 22 conducts more fully and follower circuit 26 including transistor 38 provides the additional current from power supply $V_{cc}$. The slope of the current at this point is exponential: it is very short and steep and makes it difficult to maintain a stable gain control.

This can be seen more readily in FIG. 2 where the curve of output power versus control voltage 40 is shown to operate at a fairly flat low level 39 until approximately 2.2 volts where it rises sharply and steeply to about 2.3 volts where it levels off again creating a control range 42 which is quite short and steep. The lower end 44 of range 42 is at approximately 2.2 volts, the upper end 46 of range 42 is at approximately 2.3 volts. The steepness of the slope of portion 42 is shown more clearly by curve 48 which is the derivative of the slope and indicates very high peak slope greater than 500 at 50.

Figure 4:
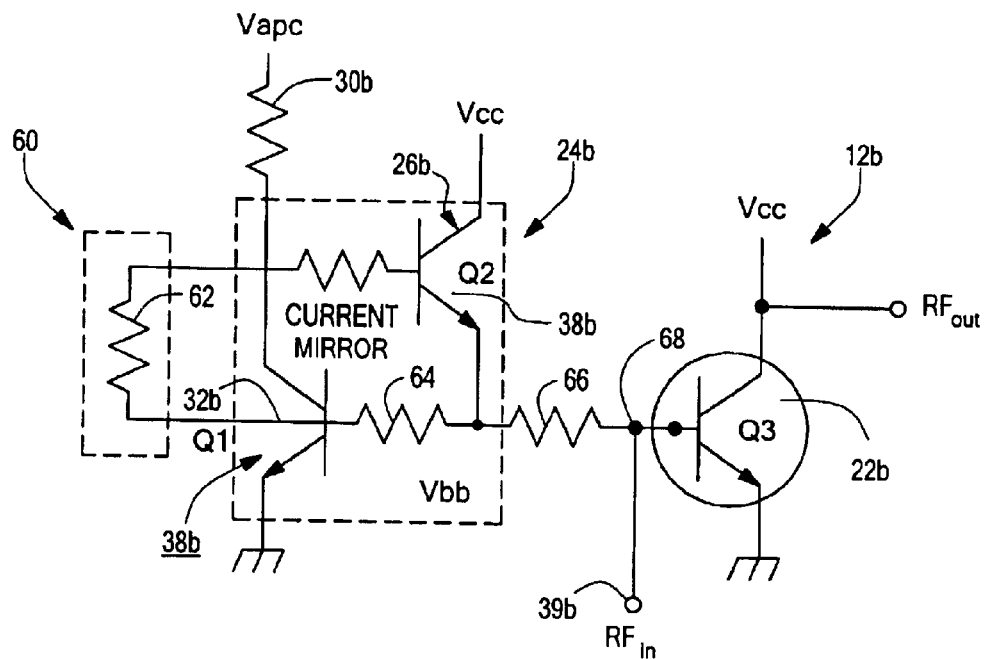
FIG. 4 is a schematic diagram of a power controller circuit employing a supplemental linear power control circuit in accordance with this invention.

In accordance with this invention, power controller circuit 24b employs a linear power control circuit 60, FIG. 4 to supplement exponential power control circuit 26b. Thus the linear power control circuit 60 provides a supplementary source of current through resistance 62 and resistances 64 and 66 to the base of 68 of transistor 22b so that even when the power control signal $V_{apc}$ is low, there is increased conduction by transistor 22b. This results in a change in the shape of curve 40b, FIG. 5, wherein the lower portion 39b is raised to extend and at the same time reduce the slope of the control signal range 42b.

Figure 3:
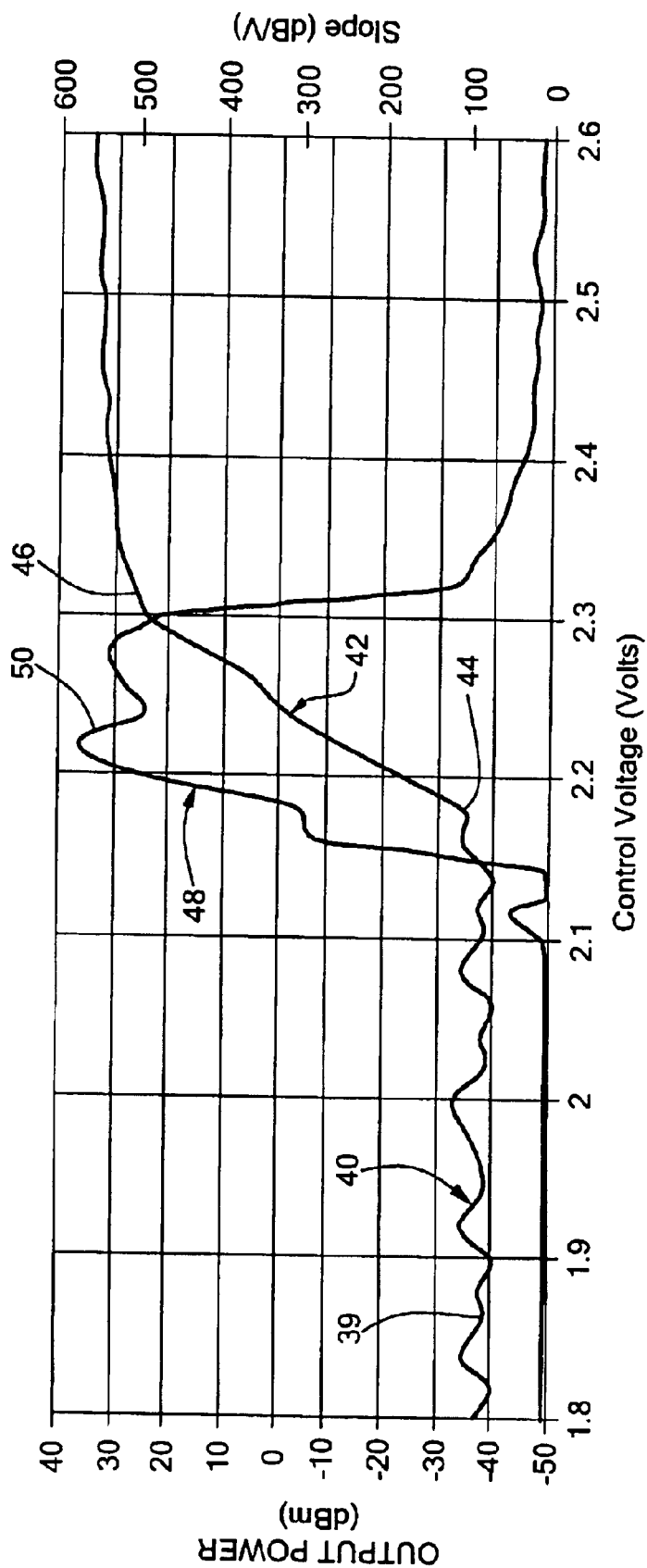
FIG. 3 illustrates the output voltage characteristic and slope for the prior art power amplifier stage of FIG. 2.
Figure 6:
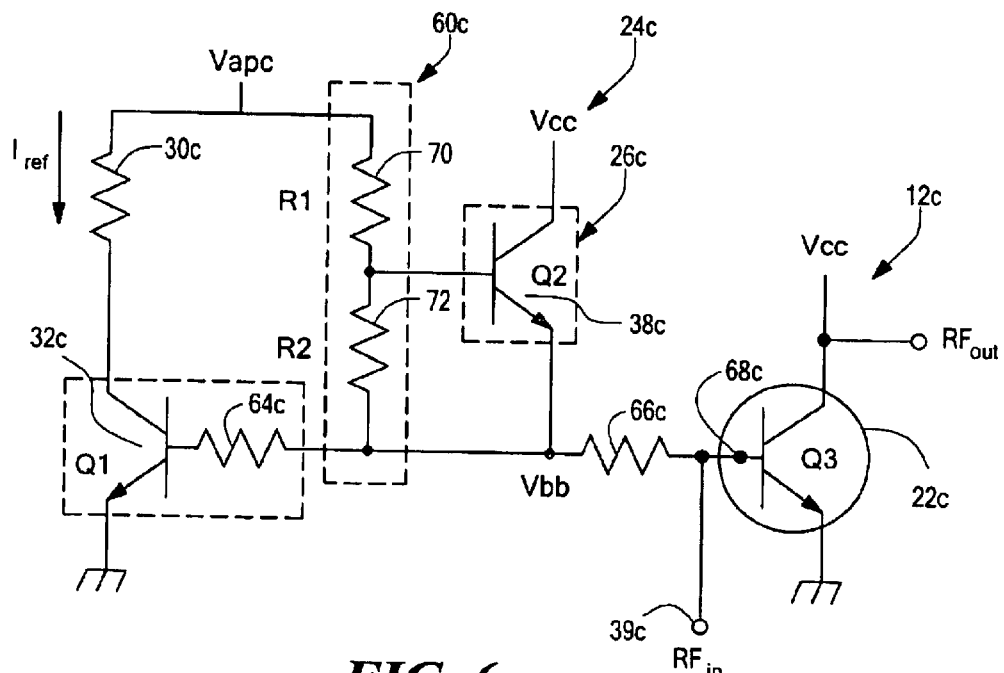
FIG. 6 is a schematic diagram similar to FIG. 4 showing an alternative construction of the power controller circuit according to this invention.

In another implementation, linear power control circuit 60c, FIG. 6 includes a pair of resistances 70, 72 connected as a voltage divider between the power control signal $V_{apc}$ and the base 68c of transistor 22c through resistance 66c. In addition, power controller circuit 24c includes transistor 32c acting less as a current mirror and more as a load circuit, so that as curve 40, FIG. 3, reaches the top 46 of control range 42 it draws down some current and reduces the steepness of the upper portion of the range 46c, FIG. 7.

Figure 8:
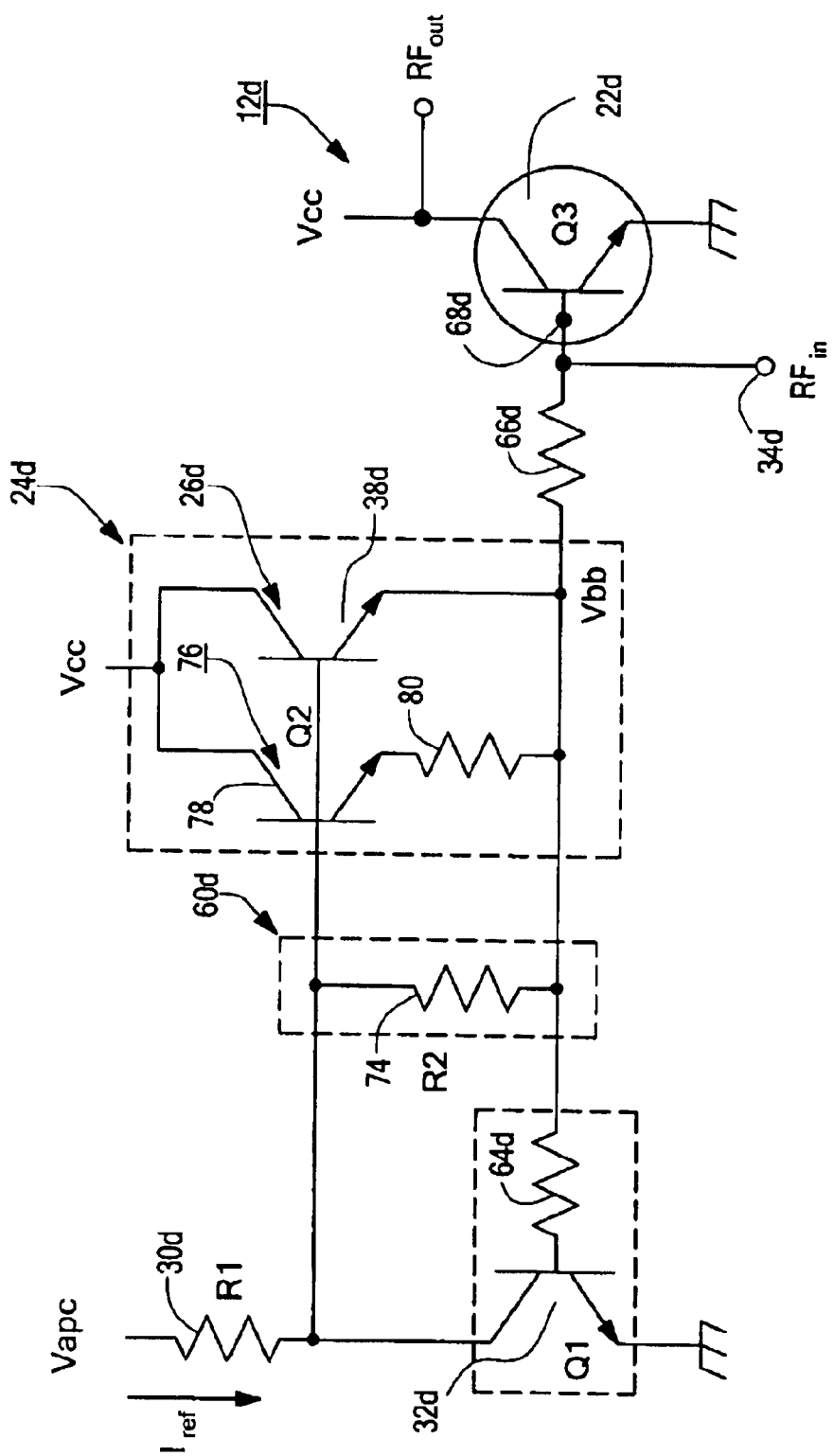
FIG. 8 is a schematic diagram similar to FIG. 4 showing yet another alternative construction of the power controller circuit according to this invention.

In still another embodiment, linear power control circuit 60d, FIG. 8, includes a single resistance 74, while exponential power control circuit 26d includes, in addition to follower 26d including transistor 38d, a second degenerative emitter follower 76 including transistor 78 and resistor 80. Follower 76 further augments control curve 40d and resistor 80 can be adjusted for optimum performance. In this embodiment, transistor 32d is acting as a current mirror once again partially at least, and partially as a load on transistor 22d which also goes to soften the upper portion 46d, FIG. 9, of the control range 42d of the curve 40d.

Figure 5:
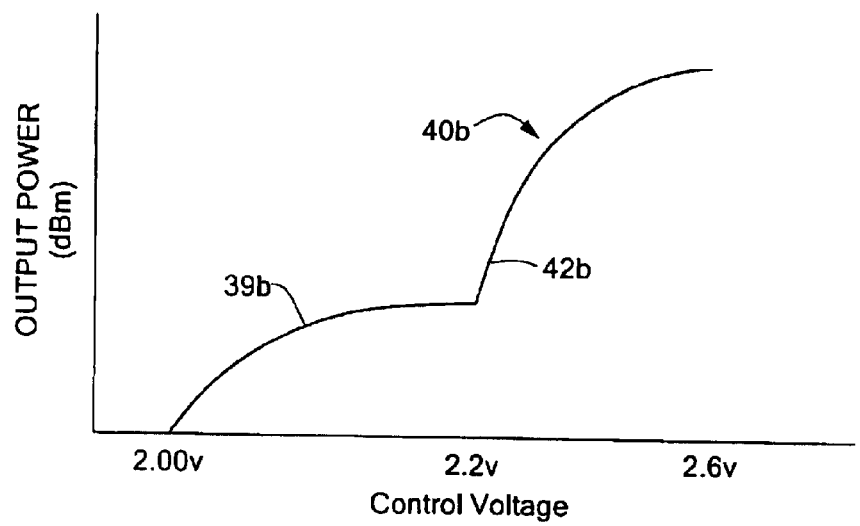
FIG. 5 illustrates the output power for the power amplifier of FIG. 4.
Figure 7:
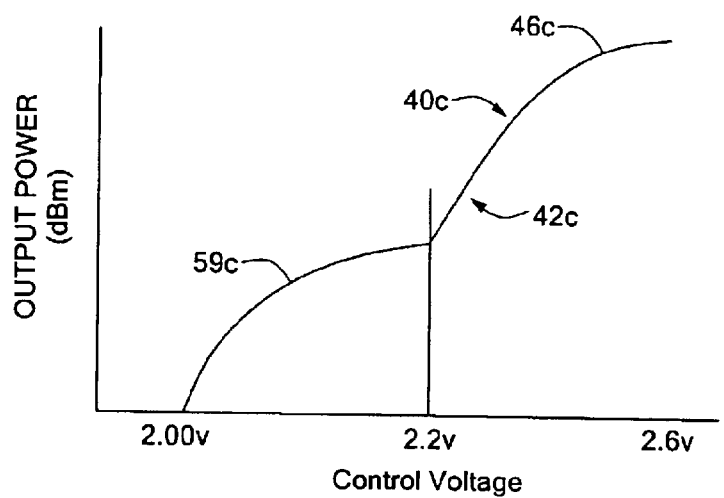
FIG. 7 illustrates the output power for the power amplifier of FIG. 6.
Figure 9:
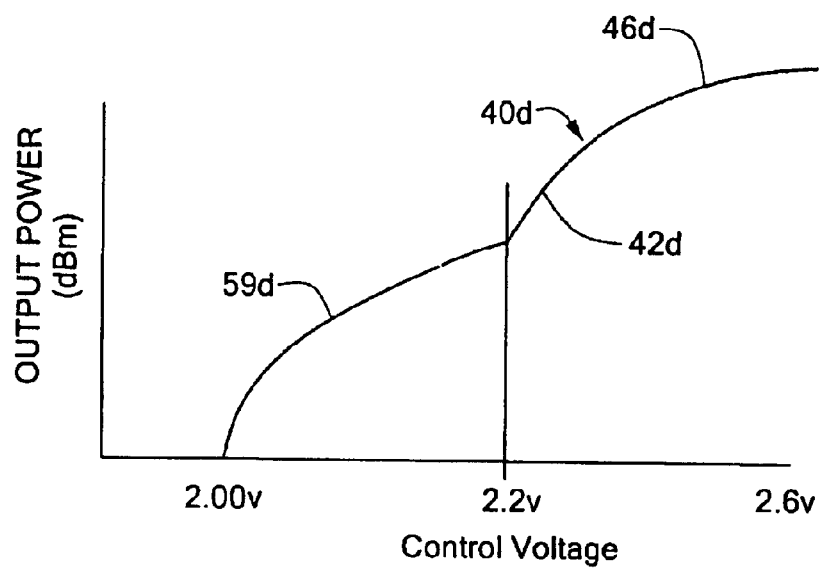
FIG. 9 illustrates the output power for the power amplifier of FIG. 8.
Figure 10:
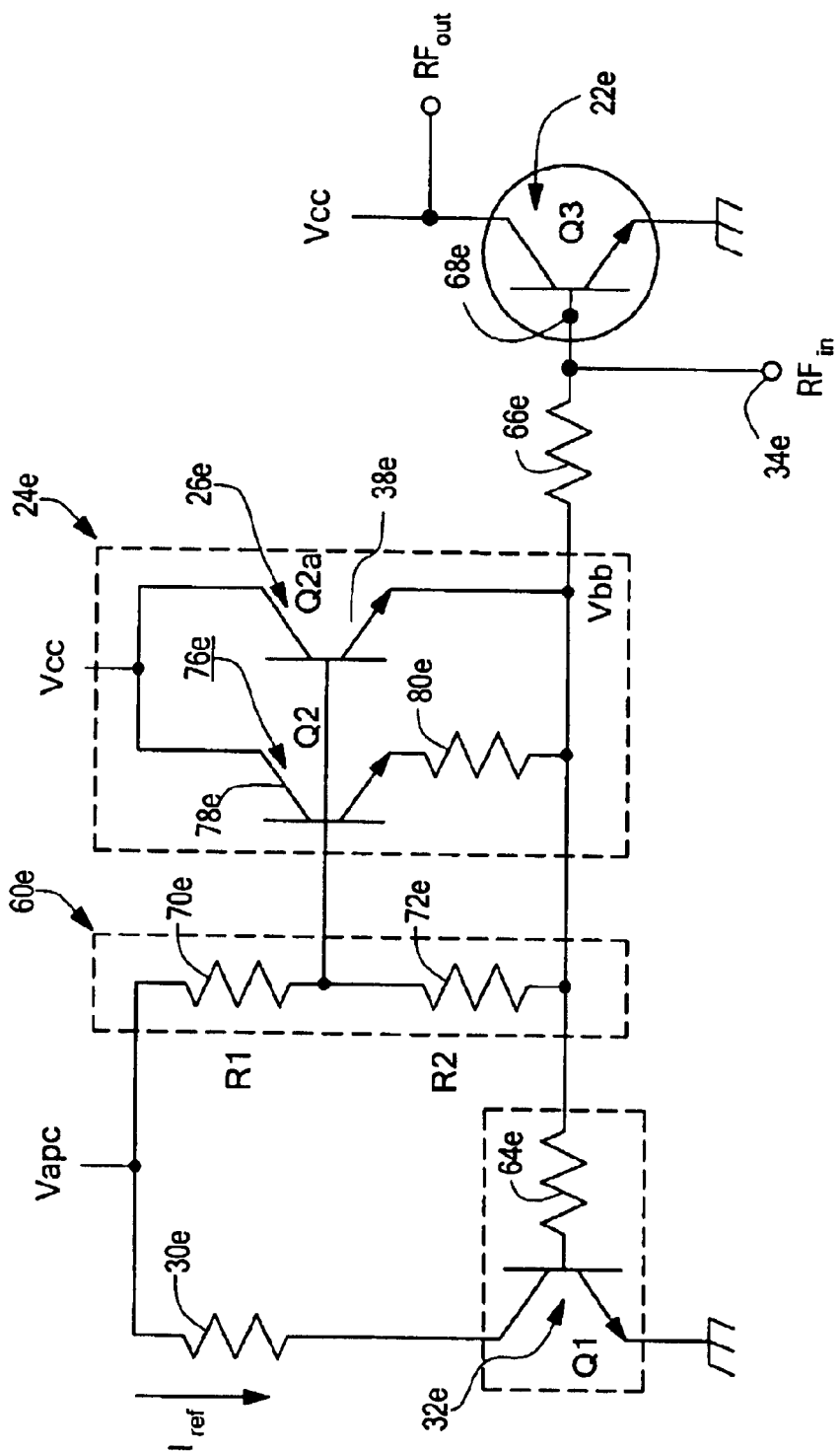
FIG. 10 is a schematic diagram similar to FIG. 4 showing still another alternative construction of the power controller circuit according to this invention.
Figure 11:
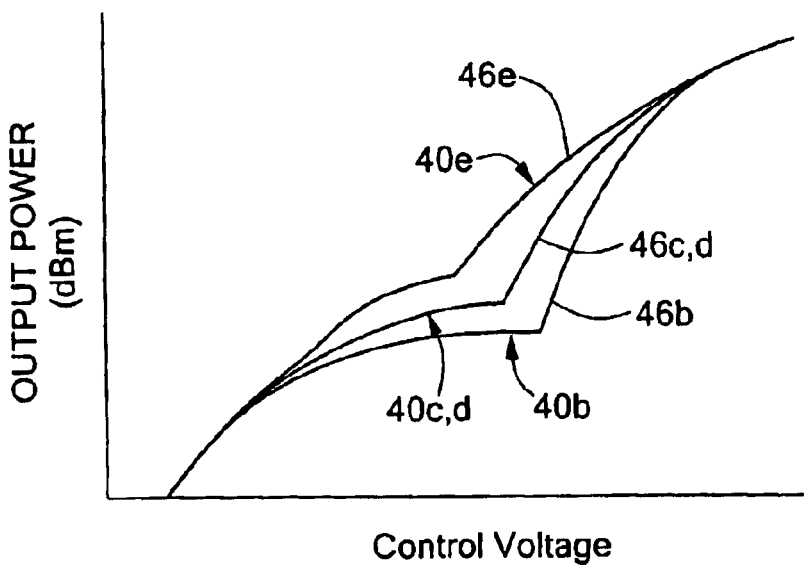
FIG. 11 illustrates the improved output power for the power amplifier of FIG. 10.

In yet another implementation, there is employed exponential power control circuit 24e, FIG. 10, follower 26e, and degenerative emitter follower 76e in combination with linear power control circuit 60e that includes a voltage divider network of resistors 70e and 72e, and transistors 32e operating more fully as a load to produce an even more improved, reduced and extended slope characteristic 40e, FIG. 11, with a more reduced peak slope as shown in comparison with the curves 40b, 40c, and 40d represented in FIGS. 5, 7, and 9.

Figure 12:
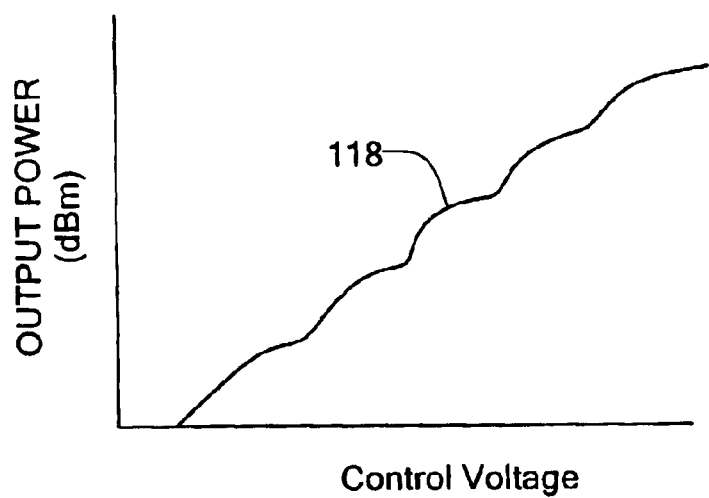
FIG. 12 illustrates the further improvement in output power when each stage is provided with its own power controller.

If each power stage 12, 14, and 16, FIG. 1 were provided with its own power controller 112, 114, and 116, respectively, the power output curve 118, FIG. 12, would be substantially smoother.

This invention in its various embodiments is easily implementable in monolithic integrated circuits including CMOS, Bipolar, and BiCMOS types of circuits and works well using gallium arsenide HBT technology.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. A power controller circuit for a power amplifier stage comprising:
   an exponential power control circuit responsive to a power control signal for providing an exponential control current to control the power amplifier stage; and
   a linear power control circuit responsive to said power control signal for supplementing said exponential control current to said power amplifier stage with a linear control current to produce a composite control current with a reduced and extended slope.

2. The power controller circuit of claim 1 in which said exponential power control circuit includes a current mirror.

3. The power controller circuit of claim 1 in which said exponential power control circuit includes an emitter follower.

4. The power controller circuit of claim 2 in which the current mirror includes two or more gallium arsenide HBT transistors.

5. The power controller circuit of claim 1 in which said linear power control circuit includes a resistance connected to said power stage in parallel with said exponential power control circuit.

6. The power controller circuit of claim 1 in which said linear power control circuit includes a voltage divider circuit connected to said power stage in parallel with said exponential power control circuit.

7. The power controller circuit of claim 1 further including a load circuit for drawing current from said power stage to reduce the slope of said composite control current at the upper end of the power control signal range.

8. The power controller circuit of claim 1 in which said exponential power control circuit includes a follower circuit.

9. The power controller circuit of claim 8 in which said exponential power control circuit includes a second degenerative emitter follower circuit for reducing the slope of said composite control current at the upper end of the power control signal range.

10. The power controller circuit of claim 8 in which the follower circuit includes at least one transistor.

11. The power controller circuit of claim 10 in which the at least one transistor is a gallium arsenide HBT transistor.

12. A power controller system for a multistage power amplifier comprising:
    a power controller circuit system associated with at least one of the stages and including:
    an exponential power control circuit responsive to a power control signal for providing an exponential control current to control the power amplifier stage; and
    a linear power control circuit responsive to said power control signal for supplementing said exponential control current to said power amplifier stage with a linear control current to produce a composite control current with a reduced and extended slope.

13. The power controller system of claim 12 in which said exponential power control circuit includes a current mirror.

14. The power controller system of claim 12 in which said exponential power control circuit includes an emitter follower.

15. The power controller system of claim 13 in which the current mirror includes two or more gallium arsenide HBT transistors.

16. The power controller system of claim 12 in which said linear power control circuit includes a resistance connected to said power stage in parallel with said exponential power control circuit.

17. The power controller system of claim 12 in which said linear power control circuit includes a voltage divider circuit connected to said power stage in parallel with said exponential power control circuit.

18. The power controller system of claim 12 further including a load circuit for drawing current from said power stage to reduce the slope of said composite control current at the upper end of the power control signal range.

19. The power controller system of claim 12 in which said exponential power control circuit includes a follower circuit.

20. The power controller system of claim 19 in which said exponential power control circuit includes a second degenerative emitter follower circuit for reducing the slope of said composite control current at the upper end of the power control signal range.

21. The power controller system of claim 19 in which the follower circuit includes at least one transistor.

22. The power controller system of claim 21 in which the at least one transistor is a gallium arsenide HBT transistor.

* * * * *